(12) United States Patent
Kumar

(10) Patent No.: US 10,156,596 B2
(45) Date of Patent: Dec. 18, 2018

(54) VOLTAGE MEASUREMENT CIRCUIT

(71) Applicant: Microchip Technology Incorporated, Chandler, AZ (US)

(72) Inventor: Ajay Kumar, Phoenix, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 54 days.

(21) Appl. No.: 15/375,092

(22) Filed: Dec. 11, 2016

(65) Prior Publication Data

US 2017/0168096 A1 Jun. 15, 2017

Related U.S. Application Data

(60) Provisional application No. 62/265,644, filed on Dec. 10, 2015.

(51) Int. Cl.
*G01R 1/38* (2006.01)
*G01R 19/257* (2006.01)
*G01R 35/00* (2006.01)
*G01R 19/25* (2006.01)
*H03M 1/10* (2006.01)
*G01R 15/06* (2006.01)
*G01R 19/00* (2006.01)
G01R 31/36 (2006.01)
(Continued)

(52) U.S. Cl.
CPC ........... *G01R 19/257* (2013.01); *G01R 15/06* (2013.01); *G01R 19/0038* (2013.01); *G01R 19/2509* (2013.01); *G01R 35/005* (2013.01); *H03M 1/1009* (2013.01); *G01R 19/16542* (2013.01); *G01R 31/362* (2013.01); *H03M 1/0619* (2013.01)

(58) Field of Classification Search
CPC .. G01R 19/257; G01R 19/0038; G01R 15/06; G01R 31/362; G01R 27/2605
See application file for complete search history.

(56) References Cited

U.S. PATENT DOCUMENTS

| | | | |
|---|---|---|---|
| 6,864,814 B1 | 3/2005 | Fike | 341/120 |
| 8,766,833 B1 | 7/2014 | Bogner | 341/120 |

(Continued)

FOREIGN PATENT DOCUMENTS

| | | | | |
|---|---|---|---|---|
| WO | 96/09557 A1 | 3/1996 | | G01R 35/00 |
| WO | 2008/045426 A2 | 4/2008 | | G01R 19/00 |

OTHER PUBLICATIONS

International Search Report and Written Opinion, Application No. PCT/US2016/066089, 13 pages, dated Mar. 23, 2017.

(Continued)

*Primary Examiner* — Thang X Le
(74) *Attorney, Agent, or Firm* — Slayden Grubert Beard PLLC

(57) ABSTRACT

A method for measuring a voltage using a capacitive voltage divider (CVD) and an analog-to-digital converter includes the steps of measuring a bandgap or reference voltage and determining a first code value of the bandgap or reference voltage, charging a first capacitor to a voltage to be measured and determining a second code value of voltage of the first capacitor, charging a second capacitor to a second known voltage and determining a third code value of voltage of the second capacitor, and determining the voltage to be measured by applying the first, second, and third code values.

21 Claims, 2 Drawing Sheets

(51) Int. Cl.
*G01R 19/165* (2006.01)
*H03M 1/06* (2006.01)

(56) References Cited

U.S. PATENT DOCUMENTS

| | | | |
|---|---|---|---|
| 9,223,332 B1* | 12/2015 | Himmelbauer | G05F 3/02 |
| 9,584,150 B2* | 2/2017 | Bogner | H03M 1/1014 |
| 9,800,258 B2* | 10/2017 | Martens | H03M 1/1047 |
| 2011/0254569 A1 | 10/2011 | Bogner et al. | 324/679 |
| 2011/0254716 A1* | 10/2011 | Makihara | H03M 1/0695 |
| | | | 341/122 |
| 2012/0223848 A1 | 9/2012 | Gu | 341/120 |
| 2013/0044017 A1* | 2/2013 | Matsuzawa | H03M 1/165 |
| | | | 341/136 |
| 2015/0280730 A1* | 10/2015 | Tanaka | H03M 1/066 |
| | | | 73/514.32 |

OTHER PUBLICATIONS

Davison, Burke, "AN1478: mTouchTM Sensing Solution Acquisition Methods Capacitive Voltage Divider," Microchip Technology Incorporated, 28 pages, Oct. 26, 2012.

* cited by examiner

VOLTAGE MEASUREMENT CIRCUIT

RELATED PATENT APPLICATION

This application claims priority to commonly owned U.S. Provisional Patent Application No. 62/265,644; filed Dec. 10, 2015; which is hereby incorporated by reference herein for all purposes.

TECHNICAL FIELD

The present disclosure relates to methods and apparatus for measuring a voltage, in particular, a battery or super-capacitor voltage.

BACKGROUND

Low power devices, in particular low power battery or super-capacitor operated devices, require a measurement and monitoring of the supply voltage. Conventional measurement of the battery or super-capacitor voltage produces a quiescent current that may discharge the battery or super-capacitor.

SUMMARY

Embodiments of the present disclosure include a voltage measurement circuit that includes a sensor configured to measure a bandgap/reference voltage, a capacitive voltage divider (CVD), an analog-to-digital converter (ADC), and a control circuit configured to: measure, with the ADC, a bandgap/reference voltage and determining a first code value of the bandgap voltage, charge a first capacitor to a voltage to be measured and determine, with the ADC, a second code value of voltage of the first capacitor, charge a second capacitor to a second known voltage and determine, with the ADC, a third code value of voltage of the second capacitor, and determine the voltage to be measured by applying the first, second, and third code values.

In combination with any of the above embodiments, a computer, electronic device, system, or apparatus may include such a voltage measurement circuit. In combination with any of the above embodiments, a method may be performed. A method for measuring a voltage using a CVD and an analog-to-digital converter includes the steps of measuring a bandgap/reference voltage and determining a first code value of the bandgap/reference voltage, charging a first capacitor to a voltage to be measured and determining a second code value of voltage of the first capacitor, charging a second capacitor to a second known voltage and determining a third code value of voltage of the second capacitor, and determining the voltage to be measured by applying the first, second, and third code values.

In combination with any of the above embodiments, the voltage to be measured is further determining by applying a factor to convert the code values. In combination with any of the above embodiments, the factor is based upon a bit size of an analog to digital converter that is to determine the code values. In combination with any of the above embodiments, the first capacitor and the second capacitor are a same capacitor. In combination with any of the above embodiments, performing analog to digital conversion to find the voltage to be measured produces no quiescent current. In combination with any of the above embodiments, the voltage to be measured is further determined by dividing the value of the battery or super-capacitor measurement by the value of the bandgap/reference and by the known voltage.

DETAILED DESCRIPTION

Figure 1:
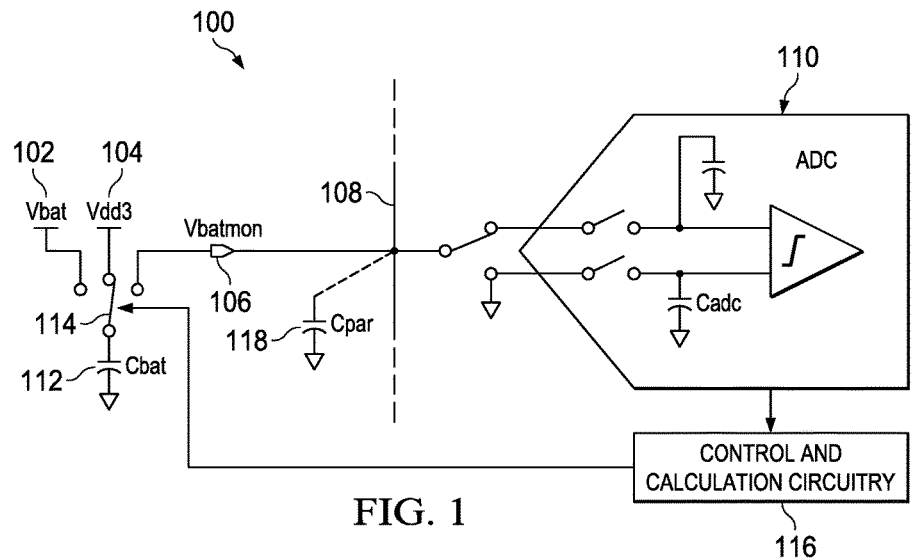
FIG. 1 illustrates an example of a system for measuring a voltage, in accordance with embodiments of the present disclosure.

FIG. 1 illustrates an example of a system 100 for measuring a voltage, in accordance with embodiments of the present disclosure. In one embodiment, system 100 may be configured to measure a battery or super-capacitor voltage. In another embodiment, system 100 may be configured to measure a voltage without quiescent current. In yet another embodiment, system 100 may be configured to adjust a battery or super-capacitor voltage measurement by performing another measurement of bandgap voltage. System 100 may be implemented in any suitable device that has a voltage or battery or super-capacitor voltage that is to be measured, such as a microcontroller, computer, mobile device, wearable, or integrated circuit.

System 100 may be configured to measure a voltage such as vbat 102. Vbat 102 may include the voltage of a battery, super-capacitor, or other power source of a device. Vbat 102 may include the voltage at the positive terminal of such a battery or super-capacitor or other power source. Vbat 102 may include the voltage of a back-up source of power for the device. Measuring vbat 102 directly might not provide entirely accurate readings due to parasitic influences from other portions of the device. Specifically, measuring vbat 102 might require use of a voltage divider and such a voltage divider may cause various side-effects.

Accordingly, in one embodiment, system 100 may measure vbat 102 in conjunction with other voltages of the device, such as a bandgap voltage from the device on which system 100 resides so that a measurement for vbat 102 can be adjusted for the parasitic influence. The bandgap voltage may represent a fixed value of the system and, as such, a code value of an analog to digital converter for the bandgap voltage can be used to adjust the measurement of vbat 102. Instead of the bandgap voltage, another known reference voltage may be used. In another embodiment, system 100 may measure another voltage vdd3 104. Vdd3 104 may include voltage from another power supply of the same device, such as a positive supply rail. Vdd3 104 may represent positive supply voltage from a field-effect transistor (FET)-based power supply. Vdd3 104 may be implemented by any known voltage. Vbat 102 may, directly or indirectly, provide power to vdd3 104. Each of vdd3 104 and vbat 102 may be pins of the same integrated circuit device.

In a further embodiment, system 100 may include a switch 114 that may optionally switch between measurement of vdd3 104 and vbat 102. Switch 114 may be controlled by control and calculation circuitry (CCC) 116. Switch 114 may be implemented in any suitable manner, such as by switching or routing circuitry. Switch 114 may control access to a sensor such a voltage sensor 106, labeled "Vbatmon" in FIG. 1. Sensor 106 may be implemented in any suitable manner. In one embodiment, sensor 106 may route a voltage sense node from one of vdd3 104 or vbat 102 to an analog to digital converter (ADC) 110. ADC 110 may be implemented in any suitable manner to generate a digital value from an analog value. ADC 110 may output its value to CCC 116. Although a single instance of switch 114, sensor 106, and ADC 110, system 100 may be implemented with any suitable number and combination of these elements. For example, a switch may be omitted while multiple sensors 106 are each respectively connected to vbat 102 and vdd3 104, and furthermore each respectively connected to ADCs 110, which are each in turn connected to CCC 116.

CCC 116 may be configured to control operation of system 100 to correctly calculate, measure, and monitor voltage such as those from vbat 102. CCC 116 may be implemented in any suitable manner, such as by analog circuitry, digital circuitry, digital logic, instructions of execution in a processor, or any suitable combination thereof.

Vbat 102 may include a smaller or larger voltage range than vdd3 104, and as such one of vbat 102 or vdd3 104 may be adjusted according to the available range of ADC 110. In one embodiment, vdd3 104 may include voltages in the range of 1.71V to 3.63V. In another embodiment, vbat 102 may include voltages in the range of 2.0V to 3.63V. In such embodiments, as the full scale of ADC 110 can be defined by vdd3 104 (with the wider voltage than vbat 102), then vbat 102 could have its scale increased with a higher, larger scale. In order to achieve a larger scale to match, for example, that of vdd3 104 (or any other range causing ADC 110 to be implemented with a wider range), system 100 may include any suitable mechanism. For example, system 100 may include a resistive divider to cause the voltage of vbat 102 to be divided in half. The actual value of vbat 102 would be later compensated for such a correction by, for example, multiplying by two. Another example of such system could be to add an additional capacitor along with parasitic capacitor 118 on ADC 110 input so further attenuate the signal.

However, system 100 may be implemented in a device with tight power requirements. For example, system 100 may be implemented in a device that includes a sleep or hibernation mode in which the total budget is 800 nA. A resistive divider, even though configured to duty-cycle and turn once in ten minutes, can consume 25-50 nA. Thus, the problems of the resistive divider may be addressed. Some solutions might use a larger resister in the resistive divider to address these problems. However, using a larger resister in the resistive divider to address these problems may further cause issues with a necessary larger area on die for the semiconductor device. Furthermore, longer time might be required to settle capacitors of ADC 110. In addition, this may cause additional shoot-through current. Some solutions might use a PMOS as resistor to address these problems, as a PMOS requires less area on die than other resistors. However, using a PMOS as a resister might require a longer settling time. Furthermore, the diode and transistor current consumption may burn quiescent current at a rate of, for example, 2-5 uA at full-charge and −500 nA at low-charge, or 3-10 uA at higher voltages (such as above 2.5V). The algorithm to measure the absolute vbat 102 in such cases may include first determining bandgap/reference voltage of a device upon which system 100 resides. The bandgap/reference voltage may be measured by ADC 110 while CCC 116 detaches Vbatmon 106 and the left-hand of the circuit. A code value produced by ADC 110 corresponding to the bandgap/reference voltage mat be designated as Cx. The actual voltage represented by Cx (or other code values produced by CCC 116) may be determined through, for example, normalization according to the accuracy and range of ADC 110. For example, with a given range of 4,096 values (when ADC 110 is a twelve-bit converter), the code output of ADC 110 for measuring the bandgap/reference voltage (saved as Cx) might correspond to 1.2 volts in an example circuit. In other circuits, the bandgap/reference voltage may be different. A battery or super-capacitor measurement of vbat 102 may be designated, in terms of a code output of ADC 110, as Cy. Thus, in other systems such as those that use resistive dividers that fail to take into account the code values of vdd3 104, the actual (as opposed to measured) value of vbat 102 may be given as (VBAT=2*1.2/Cx*Cy).

According to various embodiments, instead of a resistive divider which has a shoot-through current, a charge-sharing from a capacitor is used to measure the battery or super-capacitor voltage. In one embodiment, system 100 may include a battery or super-capacitor capacitor, such as Cbat 112 connected in series between switch 114 and ground. Such a Cbat 112 may be used to counteract a shoot-through current that may occur in system 100. However, inclusion of Cbat 112 may require calculations to determine that absolute vbat 102. Such calculations may be performed by CCC 116 to adjust measurements otherwise made by ADC 110.

The adjustments needed to determine the absolute value of vbat 102 may arise from the fact that sensor 106 is placed at a shared channel of ADC 110 which includes a variable parasitic 118. The value of the parasitic 118, in terms of capacitance, is an attenuation factor that is dependent upon system parasitics and process variations, which may vary from device to device. Thus, in some embodiments, parasitic 118 cannot be determined in advance and accounted-for.

The attenuated voltage due to parasitic 118 may be given by $C_{VBAT}/(C_{VBAT}+C_{PAR}+C_{ADC})$. However, as discussed above, the parasitic capacitance due to parasitic 118 might not be known. Thus, it is impossible to calculate the absolute value of vbat 102 with this formula.

When using two capacitors the following equations should be considered:

$$V_{m1} = \frac{C_{b1} \cdot (C_A + C_p)}{C_{b1} + C_A + C_p} = M_1; \; V_{m2} = \frac{C_{b2} \cdot (C_A + C_p)}{C_{b2} + C_A + C_p} = M_2; \; V_{bg} = M_{bg}$$

$$\frac{V_{m1} - V_{m2}}{V_{m1} + V_{m2}} = \frac{\begin{array}{c} C_{b1} \cdot (C_A + C_p)(C_{b2} + C_A + C_p) - \\ C_{b2} \cdot (C_A + C_p)(C_{b1} + C_A + C_p) \end{array}}{\begin{array}{c} C_{b1} \cdot (C_A + C_p)(C_{b2} + C_A + C_p) + \\ C_{b2} \cdot (C_A + C_p)(C_{b1} + C_A + C_p) \end{array}}$$

$$= \frac{C_{b1} \cdot (C_{b2} + C_A + C_p) - C_{b2} \cdot (C_{b1} + C_A + C_p)}{C_{b1} \cdot (C_{b2} + C_A + C_p) + C_{b2} \cdot (C_{b1} + C_A + C_p)}$$

$$= \frac{(C_{b1} - C_{b2}) \cdot (C_A + C_p)}{2 C_{b1} C_{b2} + (C_A + C_p)(C_{b1} + C_{b2})}$$

$$C_{b1} = 2 \times C_{b2}$$
$$= 2 C_b$$
$$= \frac{C_b (C_A + C_p)}{2 C_b^2 + 3 C_b (C_A + C_p)}$$
$$= \frac{(C_A + C_p)}{2 C_b + 3 (C_A + C_p)}$$

In one embodiment, system 100 may perform three voltage measurements, one of a bandgap/reference, a second to capacitor charged with vdd3 104, and a third of a capacitor charged with vbat 102. The code value of the measured voltage of the capacitor charged with vdd3 104 may be designated as Cz. In a further embodiment, system 100 may thus solve problems associated with the impossibility of calculating the absolute value of vbat 102 as described above when using other methods. In another, further embodiment, system 100 may thus eliminate quiescent current. In yet another embodiment, system 100 may add a step to the battery or super-capacitor voltage measurement. The measurements and calculations may be directed by, for example, CCC 116.

In one embodiment, the actual value of vbat 102 may be defined by $1.2*(2^N)*Cy/(Cz*Cx)$, where N is the resolution of ADC 110.

In one embodiment, the known bandgap/reference voltage of a system including ADC 110 may be measured and its code value assigned to the value of Cx. Furthermore, the number of bits of ADC 110 may be defined by N and may be, for example, twelve, leading to the factor of 4,096. The factor of 1.2 may arise from the known (as opposed to measured) bandgap/reference voltage value of, for example, 1.2V.

In another embodiment, the voltage of vbat 102 may be measured by or at sensor 106 when switch 114 is switched to vbat 102. The code value of the measured voltage of vbat 102 may be assigned to the value of Cy. The measurement of vbat 102 may be made when Cbat 112 is charged with voltage from vbat 102.

In yet another embodiment, the voltage of vdd3 104 may be measured by or at sensor 106 when switch 114 is switched to vdd3 104. The code vale of the measured voltage of vdd3 104 may be assigned to the value of Cz. The measurement of vdd3 104 may be made when Cbat 112 is charged with voltage from vdd3 104. As discussed above, any known reference voltage may be used for vdd3 104.

The calculation of the actual voltage of the battery or super-capacitor, given by $1.2*(2^N)*Cy/(Cz*Cx)$, may be performed by, for example, CCC 116. The calculation may be performed through any suitable adder, multiplier, or divisor circuits or instructions. The result of the calculation may be stored in memory, a register, or other suitable destination.

Figure 2:
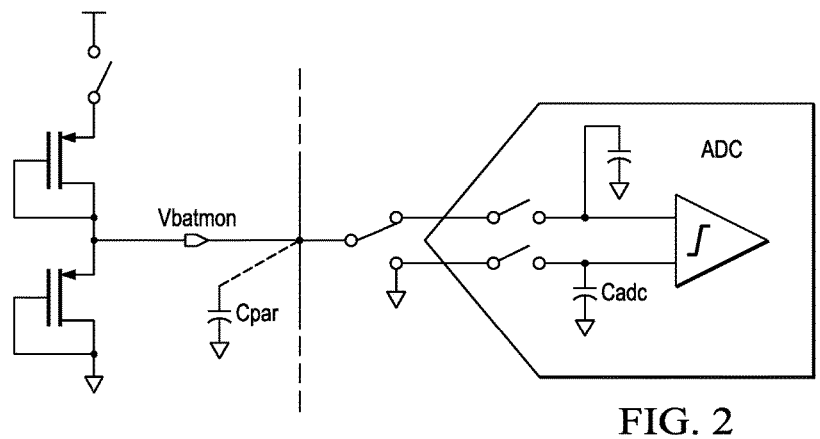
FIG. 2 illustrates an example of a circuit for providing a resistive divider to divide battery or super-capacitor voltage according to the range required by an ADC.

FIG. 2 is an illustration of an example of a circuit for providing a resistive divider to divide battery or super-capacitor voltage according to the range required by an ADC. The divider may be accomplished by a transistor network. However, as discussed above, this may cause a quiescent current of 3-10 uA at higher voltages (>2.5V). Thus, in some embodiments, the system 100 of FIG. 1 may be used instead, wherein a capacitor is used between the battery or super-capacitor voltage and ground, and the voltage of the battery or super-capacitor is measured and adjusted.

Figure 3:
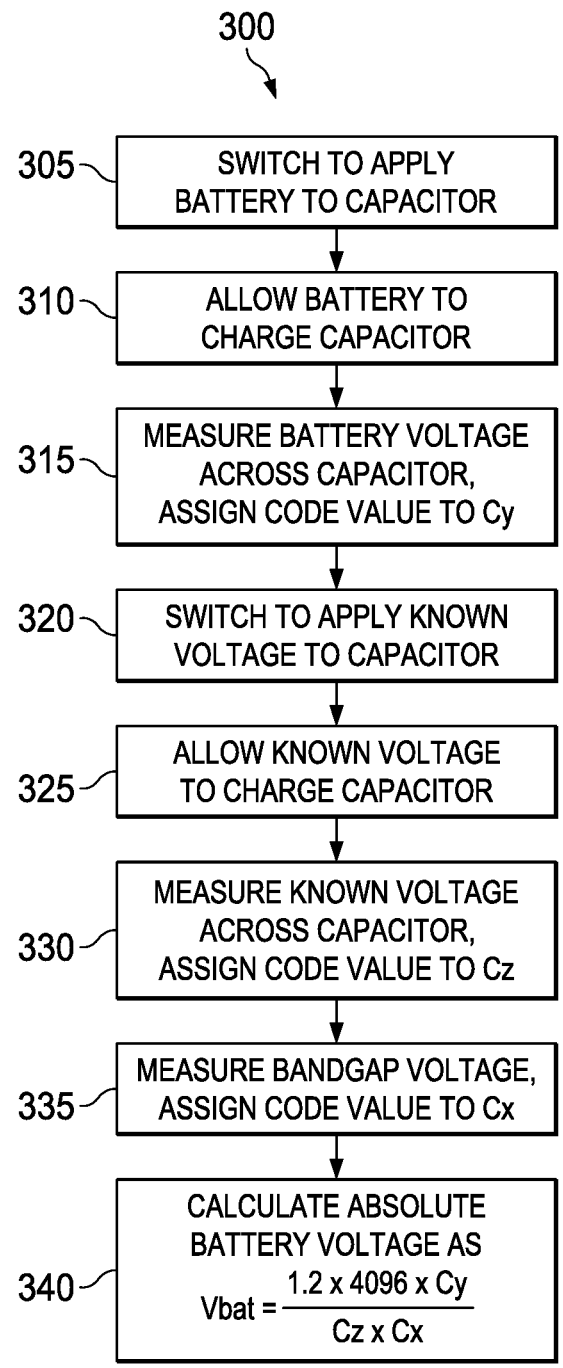
FIG. 3 illustrates an example of a method for measuring a voltage, in accordance with embodiments of the present disclosure.

FIG. 3 illustrates an example of a method 300 for measuring a voltage, in accordance with embodiments of the present disclosure.

At 305, a battery or super-capacitor to be measured may be switched so as to be applied to a capacitor. At 310, the capacitor may be charged by the battery or super-capacitor. At 315, the voltage across the capacitor, representing the voltage of the battery or super-capacitor, may be measured. This measurement, in terms of a code value, may be defined as Cy.

At 320, a known voltage may be switched to as to be applied to the capacitor. At 325, the capacitor may be charged by the battery or super-capacitor. At 330, the voltage across the capacitor representing the known voltage, may be measured. This measurement, in terms of a code value, may be defined as Cz.

At 335, a bandgap/reference voltage may be measured with respect to a system on which the ADC making the measurements resides. This measurement, in terms of a code value, may be defined as Cx.

At 340, the real, or actual, battery or super-capacitor voltage may be calculated and compensated for parasitic capacitance. The real battery or super-capacitor voltage may be defined as $1.2*4096*Cy/(Cx*Cz)$. The factor of 1.2 may be the known bandgap/reference voltage value. The factor of 4,096 may be derived from the size of an ADC performing the measurements of method 300. Thus, these factors may vary for different hardware. Method 300 may be optionally repeated or may terminate.

Method 300 may be implemented by any suitable mechanism, such as by system 100 and the elements of FIG. 1. In particular, method 300 may be operated by CCC 116. Method 300 may optionally repeat or terminate at any suitable point. Moreover, although a certain number of steps are illustrated to implement method 300, the steps of method 300 may be optionally repeated, performed in parallel or recursively with one another, omitted, or otherwise modified as needed. For example, the groups of steps 305/310/315, 320/325/330, and 335 may be performed in any order. Method 300 may initiate at any suitable point, such as at 305.

Although example embodiments have been shown above, changes, additions, subtractions, or other permutations may be made to these embodiments without departing from the spirit and scope of the present disclosure, according to the knowledge and ability of one of ordinary skill in the art.

The invention claimed is:

1. A capacitive voltage divider (CVD) method for measuring a voltage using a capacitor, an analog-to-digital converter (ADC) comprising a sample and hold capacitor and a control circuit, comprising the steps of:
    measuring a bandgap or reference voltage by the ADC and determining a first code value of the bandgap or reference voltage;
    performing a first CVD measurement through the control circuit by charging the capacitor to a voltage to be measured and coupling the charged capacitor with a sample & hold capacitor of the ADC to perform a CVD measurement thereby determining a second code value;
    performing a second CVD measurement through the control circuit by charging the capacitor to a known second voltage coupling the charged capacitor with a sample & hold capacitor of the ADC to perform a CVD measurement thereby and determining a third code value; and
    determining by the control circuit the voltage to be measured by applying the first, second, and third code values.

2. The method of claim 1, wherein the bandgap voltage is 1.2V.

3. The method of claim 1, wherein N=4096.

4. The method of claim 1, wherein the steps are performed by a control and calculation circuitry.

5. The method of claim 1, wherein performing analog to digital conversion to find the voltage to be measured produces no quiescent current.

6. The method of claim 1, wherein the step of determining the voltage to be measured comprises the step of calculating $Vbg*2^N*Cy/(Cz*Cx)$, wherein Vbg represents the bandgap or reference voltage, N represents the number of bits of the ADC, Cx represents the first code value, Cy represents the second code value, and Cz represents the third code value.

7. The method of claim 1, wherein the known second voltage is a supply voltage.

8. A voltage measurement circuit, comprising:
a capacitive voltage divider (CVD) measurement circuit comprising a capacitor, a switching circuit and an analog-to-digital converter (ADC);
and
a control circuit configured to:
measure, by the ADC, a bandgap or reference voltage thereby determining a first code value;
charge the capacitor to a voltage to be measured and couple the charged capacitor with a sample & hold capacitor of the ADC to perform a CVD measurement thereby determining, by the ADC, a second code value;
charge the capacitor to a known second voltage and couple the charged capacitor with a sample & hold capacitor of the ADC to perform a CVD measurement thereby determining, by the ADC, a third code value; and
determine the voltage to be measured by applying the first, second, and third code values.

9. The voltage measurement circuit of claim 8, wherein the bandgap voltage is 1.2V.

10. The voltage measurement circuit of claim 9, wherein N=4096.

11. The voltage measurement circuit of claim 8, wherein the CVD measurement circuit comprises a parasitic capacitance.

12. The voltage measurement circuit of claim 8, wherein performing the analog to digital conversion produces no quiescent current.

13. The voltage measurement circuit of claim 8, wherein for determining the voltage the control circuit is configured to calculate $Vbg*2^N*Cy/(Cz*Cx)$, wherein Vbg represents the bandgap or reference voltage, N represents the number of bits of the ADC (110), Cx represents the first code value, Cy represents the second code value, and Cz represents the third code value.

14. The voltage measurement circuit of claim 8, wherein the known second voltage is a supply voltage.

15. A microcontroller, comprising:
a capacitive voltage divider (CVD) measurement circuit comprising a capacitor, a switching circuit and an analog-to-digital converter (ADC);
and
a control circuit configured to:
measure, with the ADC, a bandgap or reference voltage thereby determining a first code value;
charge the capacitor to a voltage to be measured and couple the charged capacitor with a sample & hold capacitor of the ADC to perform a CVD measurement thereby determining, with the ADC, a second code value;
charge the capacitor to a known second voltage and couple the charged capacitor with a sample & hold capacitor of the ADC to perform a CVD measurement thereby determining, with the ADC, a third code value; and
determine the voltage to be measured by applying the first, second, and third code values.

16. The microcontroller of claim 15, wherein the bandgap voltage is 1.2V.

17. The microcontroller of claim 15, wherein N=4096.

18. The microcontroller of claim 15, wherein the CVD measurement circuit comprises a parasitic capacitance.

19. The microcontroller of claim 15, wherein performing the analog to digital conversion produces no quiescent current.

20. The microcontroller of claim 15, wherein for determining the voltage the control circuit is configured to calculate $Vbg*2^N*Cy/(Cz*Cx)$, wherein Vbg represents the bandgap or reference voltage, N represents the number of bits of the ADC (110), Cx represents the first code value, Cy represents the second code value, and Cz represents the third code value.

21. The microcontroller of claim 15, wherein the known second voltage is a supply voltage.

* * * * *